United States Patent [19]
Young

[11] 3,995,278
[45] Nov. 30, 1976

[54] SUPERCONDUCTIVE MAGNETOSTATIC PRINTER

[75] Inventor: Eugene F. Young, New York, N.Y.

[73] Assignee: Xerox Corporation, Stamford, Conn.

[22] Filed: Sept. 29, 1975

[21] Appl. No.: 617,341

Related U.S. Application Data

[62] Division of Ser. No. 332,664, Feb. 15, 1973, Pat. No. 3,929,477.

[52] U.S. Cl. .................................. 346/74.1; 96/1 R; 250/316; 340/173.1
[51] Int. Cl.$^2$ ........................................ G03G 19/00
[58] Field of Search ............ 346/74.1, 74 R, 74 TP; 340/173.1; 96/1 R; 250/316, 317

[56] References Cited
UNITED STATES PATENTS

| | | | |
|---|---|---|---|
| 2,839,601 | 6/1958 | Fries | 96/1 |
| 3,413,055 | 11/1968 | DeSorbo | 340/173.1 |
| 3,482,220 | 12/1969 | Cosentino | 340/173.1 |
| 3,485,621 | 12/1969 | Kazan | 96/1 |
| 3,717,459 | 2/1973 | McClure | 96/1 |

*Primary Examiner*—Jay P. Lucas
*Attorney, Agent, or Firm*—Robert J. Bird

[57] ABSTRACT

An apparatus for producing viewable images is disclosed in accordance with the teachings of the present invention wherein a character pattern comprised of modulated radiant energy is transmitted onto a surface of superconducting material disposed in an external magnetic field. The external magnetic field is less than a critical field value such that the transmitted modulated radiant energy is effective to maintain certain portions of the surface of superconducting material in their respective normal states in accordance with the character pattern when the ambient temperature is decreased below a critical temperature value, whereby magnetic flux penetrates said certain portions. Upon decreasing the ambient temperature, the superconductivity of said superconducting material is obtained and the penetrated magnetic flux is trapped in said certain portions to form a magnetostatic latent image of the transmitted character pattern. The magnetostatic latent image is then developed to form a viewable image of the character pattern. Alternatively, the superconducting material initially admits of its superconducting state and the transmitted modulated radiant energy is effective to quench the superconductivity of certain portions thereof whereby magnetic flux penetrates said certain portions. The penetrated magnetic flux is trapped in said certain portions upon the restoration of the superconductivity thereof.

1 Claim, 9 Drawing Figures

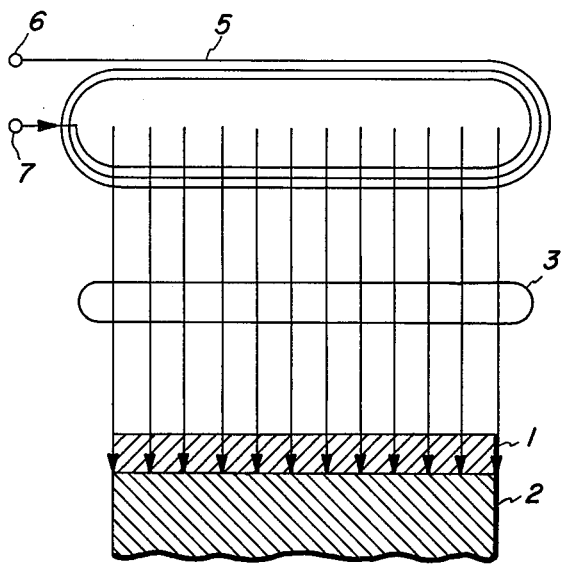
FIG. IA
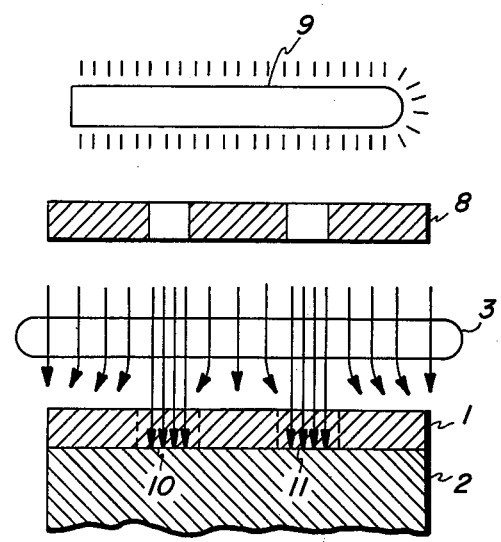
FIG. IB
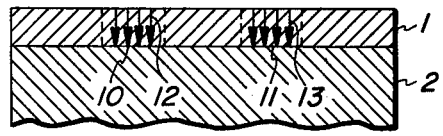
FIG. IC
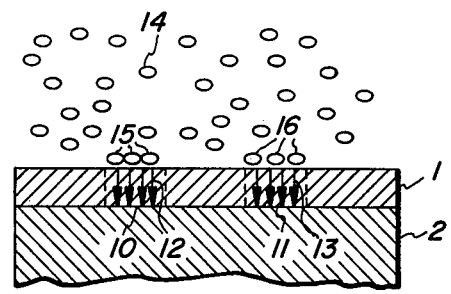
FIG. ID
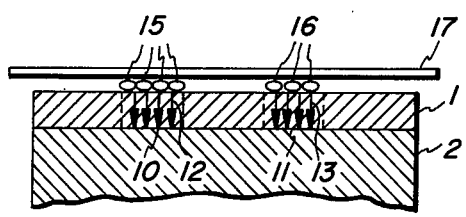
FIG. IE
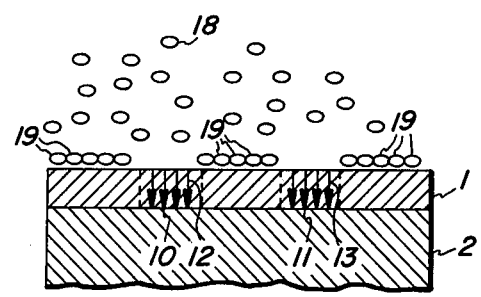
FIG. 2

SUPERCONDUCTIVE MAGNETOSTATIC PRINTER

This application is a divisional of my copending application Ser. No. 332,664, filed Feb. 15, 1973, and now U.S. Pat. No. 3,929,477.

This invention relates to a method of producing viewable images and in particular, to a method of producing viewable images wherein superconducting material is employed.

The techniques generally utilized to electrophotographically reproduce documents or the like have long been known to those skilled in the art. These techniques derive from the basic disclosure thereof in U.S. Pat. No. 2,297,691 issued to Chester F. Carlson. In accordance with the well-known techniques, modulated radiation is imaged onto a photoconductive plate to selectively dissipate a uniform layer of electrostatic charges on the surface thereof to form an electrostatic latent image of an original document. The electrostatic latent image is then developed and the developed image may then be transferred to a support surface to form a final copy of the original document. It is now proposed to utilize techniques analogous to those heretofore utilized in the electrostatic production of images to produce images on superconducting material.

It has been found that at very low temperatures certain materials exhibit an electrical resistance of essentially zero value. This phenomenon is known as superconductivity and the temperature below which the superconductive material exhibits its superconducting state is known as the critical temperature value. Various studies of superconductive materials have been performed since the discovery thereof and the characteristic properties of superconductive materials have been concluded therefrom. Accordingly, it has been found that if a superconductive material is disposed in an environment wherein the temperature is less than the critical temperature value, an externally applied magnetic field that is greater than a critical field value will drive the superconductive material out of its superconducting state. In addition, when in its superconducting state, a superconductive material exhibits excellent diamagnetic properties. That is, an externally applied magnetic field below the critical field value cannot penetrate the material. However, magnetic flux will penetrate the superconductive material once the superconductivity thereof is quenched, i.e., if the ambient temperature is increased above the critical temperature value, or if the externally applied magnetic field is increased above the critical field value. Conversely, magnetic flux that has penetrated the superconductive material will be expelled therefrom if the ambient temperature is decreased below the critical temperature value, or if the externally applied magnetic field is decreased below the critical field value. Ideal superconductive materials exhibit the so-called Meissner effect wherein the superconducting transistion is reversible. However, if the superconductive material is not homogenous but includes some imperfections therein, the magnetic flux that penetrates the superconductive material when the superconductivity thereof is quenched is trapped in the regions of inperfection when the superconducting state is restored. The magnetic flux trapped within the superconductive material remains "frozen in", even when the external magnetic field is reduced to zero, for as long as the material remains superconducting. Typical examples of superconductive material may be found at page 5 of the text *Superconductivity* by E. A. Lynton, 1962. This text may be referred to for a more complete description of the properties and attributes of superconductive materials.

The aforenoted and briefly described properties of superconductive materials have been turned to account in various switching circuits, memory circuits and the like. The present invention provides a novel adaptation of superconductive material to achieve the production of viewable images by techniques not heretofore contemplated by the prior art.

Therefore, it is an object of the present invention to provide a method of producing viewable images.

It is another object of the present invention to utilize superconductive material in producing a viewable image.

A further object of this invention is to provide a method of producing a magnetostatic latent image on the surface of a superconductive material.

Yet another object of this invention is to provide a method of producing a viewable image wherein radiant energy is employed to record character patterns on superconductive material.

A still further object of the present invention is to provide a method of magnetophotographically reproducing copies of prerecorded information.

An additional object of this invention is to provide a method of recording a character pattern comprised of thermal energy.

Various other objects and advantages of the invention will become clear from the following detailed description of an exemplary embodiment thereof and the novel features will be particularly pointed out in connection with the appended claims.

In accordance with this invention, a method of producing viewable images is provided wherein superconductive material is exposed to modulated radiant energy while being disposed in an external magnetic field that is less than a critical field value whereby magnetic flux penetrates said superconducting material; said superconducting material is driven to its superconductive state by decreasing the effective ambient temperature below a critical temperature value except for certain portions of the superconductive material that receive radiant energy such that the penetrating magnetic flux remains in said certain portions in accordance with the impinging radiant energy; said magnetic flux is subsequently trapped in said certain portions of said superconductive material, thereby forming a magnetostatic latent image, and said magnetostatic latent image is developed to produce a viewable image. Alternatively, if the superconducting material admits of its superconductive state, the superconductivity of certain portions thereof that receive radiant energy is quenched such that magnetic flux penetrates said certain portions, a magnetostatic latent image is formed by the subsequently trapped magnetic flux.

The invention will be more clearly understood by reference to the following detailed description of exemplary embodiments thereof in conjunction with the accompanying drawings in which:

FIGS. 1A–1E illustrate one embodiment of the present invention wherein a viewable image is produced on a superconductive material;

FIG. 2 illustrates another embodiment of the present invention for developing a magnetostatic latent image formed on the surface of a superconductive material.

Figure 3A:
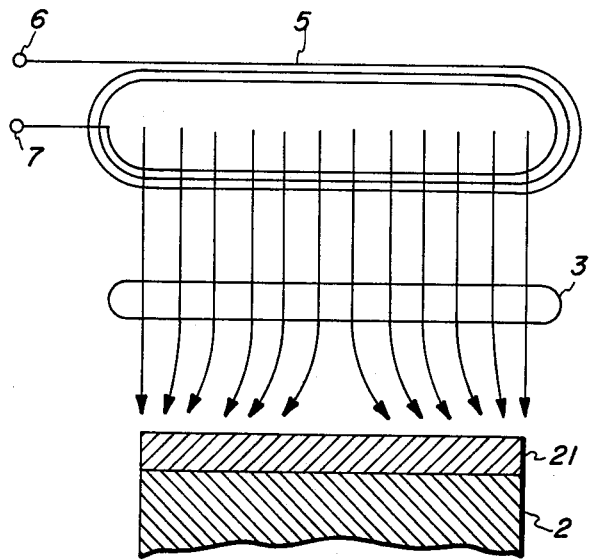
FIGS. 3A–3C illustrate a further embodiment of the present invention wherein a magnetostatic latent image is produced on a superconductive material.

Referring now to the drawings, wherein like reference numerals are used throughout, and in particular to FIG. 1A, there is illustrated a surface of superconductive material 1, substrate 2, and magnetic field producing means 5. The superconductive material 1 may, for example, be comprised of any of the elements described at pages 5 and 6 of the aforementioned text *Superconductivity*. Although the instant invention is not intended to be limited solely to those elements, the superconductive material 1 may preferably be the intermetallic compound $Nb_3Sn$, hereinafter niobium-tin. The superconductive material 1 admits of a normal state and a superconductive state. The superconductive state will be obtained when the ambient temperature is decreased below a critical temperature while the superconductive material is disposed in a zero magnetic field. The critical temperature values for most superconductive materials range from $0.4°$ K for titanium to $18.1°$ K for niobium-tin. It is well known that liquid helium exhibits a low ambient temperature sufficient to place most superconductive materials into their respective superconducting states. Accordingly, the superconductive material 1 may be adapted for immersion in a liquid helium bath or supported on a heat sink that is adapted for immersion in a liquid helium bath. Alternatively, the superconductive material may be adapted to be traversed by helium vapor derived from a liquid helium bath. The superconductive material 1, which may preferably comprise a thin film of continuous material devoid of impurities, is mounted on substrate 2 such that the superconductive material is in good thermal contact with the substrate. The substrate 2 may function as a heat sink and, accordingly, may be adapted for immersion in a liquid helium bath. It is recognized, therefore, that once the ambient temperature is decreased below the critical temperature value for the particular superconductive material, the superconductive material 1 is driven into its superconducting state and manifests the superconducting characteristics inherent thereto. Although a continuous material devoid of impurities is preferred, superconductive material 1 may include some "impurities" therein. As will be described hereinbelow, the term impurities serves to describe the microscopic or macroscopic properties of the superconductive material. Hence, the superconductive material may comprise a multiple of isolated superconductive particles suspended in a suitable resin binder, or the superconductive material may be formed of islands of superconductive material on a substrate. Additionally, the embodiment illustrated in FIG. 1A wherein superconductive material 1 comprises a surface supported on substrate 2 should not be interpreted as limiting the present invention thereto. Hence, the substrate 2 may be omitted and superconductive material 1 may itself be adapted for immersion in a liquid helium bath. In addition, the superconductive material 1 need not be limited to a thin film configuration.

In accordance with the embodiment of the present invention now described, superconductive material 1 admits of its normal state and is subjected to a magnetic field 3 applied thereto. The applied magnetic field 3 may exhibit a constant value that is less than the critical field value characteristic of the superconductive material 1. Hence, a source 5 of constant magnetic field may be juxtaposed to superconductive material 1 such that an external field of appropriate magnitude is produced. The source 5 of magnetic field may comprise an electromagnet, a permanent magnet or the like. FIG. 1A illustrates that the source 5 of the magnetic field is comprised of a coil of electrical windings including terminals 6 and 7 which are adapted to receive d.c. voltage.

The critical field value and the critical temperature value for superconductive material are mutually dependent. Accordingly, it is preferred that the magnitude of the external magnetic field 3 by just below the critical field value associated with an ambient temperature to be described such that a relatively small increase in that ambient temperature or a relatively small increase in the external magnetic field or any combination thereof results in a quenching of the superconducting state that is to be exhibited by the superconducting material. Nevertheless, it should be clearly understood that the superconductive material 1 now admits of its normal state in the presence of the external magnetic field 3. In its normal state, superconductive material 1 admits of magnetic properties whereby the magnetic field 3 is capable of penetrating therein. FIG. 1A illustrates that the lines of magnetic flux penetrate the superconductive material.

The temperature at the surface of the superconductive material 1 may be increased by projecting radiant energy of a sufficient wavelength thereon. The transmitted radiant energy may be in the form of electromagnetic waves such as light. When the electromagnetic waves impinge on the surface of the superconductive material 1, their energy is converted to heat resulting in an increase in the ambient temperature. The superconductive material, of course, maintains its normal state. FIG. 1B illustrates that the temperature of certain portions of the superconducting material 1 may be selectively increased in accordance with a determined pattern by modulating the projected radiant energy. Accordingly, a character pattern 8 is interposed between a source of radiant energy 9 and the superconductive material 1. The character pattern 8 may comprise conventional film means bearing images of information prerecorded thereon. The source of radiant energy 9 may comprise a conventional light emissive element capable of emitting visible light and infra red light upon being suitably energized. It is appreciated that the character pattern 8 is comprised of light and dark portions adapted to modulate the radiant energy transmitted therethrough such that radiant energy admitting of a maximum amplitude is transmitted through the light portions of the character pattern 8 and radiant energy admitting of a minimum amplitude is transmitted through the dark portions of the character pattern.

FIG. 1B illustrates that the character pattern 8 is imaged onto the superconductive material 1 in the presence of the external magnetic field 3. Accordingly, those portions of superconductive material 1 upon which the light areas of the character pattern are imaged will experience an increase in temperature. If the ambient temperature is now decreased below the critical temperature value, as by immersing the superconductive material in a liquid helium bath, or by exposing the superconductive material to helium vapor, or by immersing substrate 2 in a liquid helium bath, the superconductive material will be driven to its superconductive state except for those portions thereof upon which the light areas of the character pattern are imaged; said portions will remain in their normal state. Consequently, only those portions of the superconductive material 1 upon which the dark areas of the character pattern are imaged will be driven to the superconducting state. Those portions of the superconductive material 1 that have been driven into the superconducting state exhibit diamagnetic properties, thereby expelling the external magnetic field 3 therefrom. FIG. 1B illustrates that the penetrated lines of magnetic flux remain within portions 10 and 11 of superconductive material 1, which portions receive radiant energy through the light areas of character pattern 8, but are expelled from those portions of the superconductive material upon which the dark areas of the character pattern are imaged.

It is here noted that portions 10 and 11 may retain their normal state notwithstanding the decreased ambient temperature in response to impinging radiant energy that has been reflected thereto. Accordingly, character pattern 8 is not limited to the configuration of film means wherein radiant energy is transmitted therethrough. It is contemplated that the character pattern 8 may comprise a document having graphic information recorded thereon such that radiant energy transmitted thereto is modulated and reflected by the character pattern 8 to the superconductive material 1. Hence, the light image projected onto the superconductive material 1 may be a reflected image. A further embodiment of the present invention is proposed wherein the temperature of portions 10 and 11 is selectively increased in accordance with a determined pattern of thermal energy. Accordingly, a stylus comprised of an array of selectively activatable thermal elements may be positioned in proximity to superconductive material 1. A character pattern comprised of thermal energy may be produced by selectively activating the thermal elements of the stylus. The close proximity of the stylus to superconductive material 1 enables the ready transfer of thermal energy to the surface of the superconductive material whereby the temperature of corresponding portions of the superconductive material is increased. Penetrated magnetic flux is thus able to remain within these areas in the manner described hereinabove. It is here noted that, if desired, the step of imaging may precede the application of the external magnetic field to the superconductive material or may be performed substantially simultaneously therewith.

The magnetic flux 12 and 13 that has remained within the portions 10 and 11 may be trapped therein if the flux paths through the superconductive material previously provided are terminated. More particularly, rings of superconductive material form around portions 10 and 11 to trap the flux therein and to maintain the lines of flux at a constant value. If the ambient temperature is further decreased, the surrounding superconducting rings effectively "tighten" about the trapped magnetic flux. Since, however, the number of magnetic lines of flux trapped within the remaining normal areas is a constant value, the intensity of the trapped field increased. It may be appreciated that when addtional thermal energy is no longer applied to the superconductive material, as when the imaging of a character pattern is terminated, the temperature of portions 10 and 11 will decrease in a gradual and continuous manner. Hence, the superconductive material of portions 10 and 11 will gradually return to its superconducting state thereby further contracting the superconductive rings about the trapped magnetic flux.

It should be understood that the length of time required to decrease the temperature of the superconductive material such that stable superconducting rings are formed to trap the magnetic flux 12 and 13 in portions 10 and 11 is a function of the thickness of the superconductive material and the thermal contact between the superconductive material and its low temperature surroundings. At the conclusion of this time delay, the external magnetic field 3 may be removed while the trapped magnetic flux 12 and 13 is maintained in portions 10 and 11, respectively. Additionally, once rings of superconductive material form about portions 10 and 11 to interrupt the continuous flux paths previously provided, the imaged character pattern may be terminated. Termination of the imaged character pattern at this time does not result in the expulsion of magnetic flux from portions 10 and 11 because, as is now recognized, the surrounding rings of superconductive material serve to trap the flux therein. Thus, a magnetostatic latent image of a character pattern is formed in the superconductive material 1, as illustrated in FIG. 1C.

The imaged radiant energy (or thermal energy) and the external magnetic field 3 may be removed substantially simultaneously from the superconductive material 1 or in any desired order. However, it is readily apparent that if the external magnetic field 3 is removed before the ambient temperature is effectively decreased below the critical temperature value, the penetrating magnetic flux will not be trapped within portions 10 and 11. This occurs, of course, because the penetrating flux is not expelled from the superconductive material until the superconducting state is obtained. Consequently, superconducting rings cannot form about the penetrating magnetic flux until the proper ambient temperature is obtained. When the external magnetic field is removed, the penetrating magnetic flux likewise is removed. Therefore, in the illustrated embodiment, it is contemplated that the superconductive material 1 be disposed in the external magnetic field 3 and be exposed to an imaged character pattern for a sufficient period of time to permit the superconductive state thereof to be obtained and thus trap the remaining magnetic flux. The external magnetic field 3 and imaged character pattern may then be removed and the magnetic flux will remain trapped. It is here noted that, in view of the mutual dependency of the critical temperature value and critical field value, the superconductive material 1 illustrated in FIG. 1B may be driven to its superconducting state to trap magnetic flux in portions 10 and 11 thereof be decreasing both the ambient temperature and external magnetic field. As is understood, the imaged character pattern is effective in maintaining portions 10 and 11 in their normal state while the remainder of the superconducting material is driven to its superconducting state.

The magnetostatic latent image formed by the selectively trapped magnetic flux 12 and 13 and illustrated in FIG. 1C, may now be developed to form a viewable image of the original character pattern. FIG. 1D illustrates one technique that may be utilized to develop the magnetostatic latent image. Magnetic particles 14 comprised of a suitable magnetic powder, such as an iron powder or the like, mixed with a conventional pigment toner may be applied to the surface of the superconductive material 1. Various methods well known to those of ordinary skill in the art may be adopted to apply the magnetic particles 14 to the superconductive material 1. Typical methods include the cascading of the magnetic particles across the surface of the superconductive material 1, immersing the superconductive material in a liquid including the magnetic particles suspended therein, utilizing a brush to apply the magnetic particles to the superconductive material, or blowing the magnetic particles across the surface of the superconductive material. The particular method of development forms no part of the present invention per se. It is clear, however, that the magnetic particles 14 will be subject to a magnetically attracting force exerted thereon by the trapped magnetic flux 12 and 13. Hence, magnetic particles 15 are attracted by the magnetic flux 12 and adhere to portion 10. Similarly, magnetic particles 16 are attracted by magnetic flux 13 and adhere to portion 11. It is observed that if magnetic particles are utilized to develop the magnetostatic latent image, those portions on the surface of superconductive material 1 corresponding to the light areas of the character pattern 8 will be supplied with the magnetic particles. Thus, if the character pattern 8 corresponds to a photographic negative, the developing technique illustrated in FIG. 1D results in a photographically positive viewable image. However, if the character pattern 8 corresponds to an original document, the developing technique illustrated in FIG. 1D results in a photographically negative viewable image.

The developed viewable image may be transferred to a support surface such as surface 17 illustrated in FIG. E. The surface 17 may comprise paper, glass, plastic or any suitable material upon which it is desirable to record a viewable image. The magnetic particles 15 and 16 adhering to portions 10 and 11 of superconductive material 1 may be coated with an adhesive substance. If surface 17 is placed in overlying relation with respect to the superconductive material 1 such that the surface contacts the magnetic particles 15 and 16, the adhesive coating will cause the magnetic particles to adhere to the surface 17. The magnetic particles thus transferred to the surface 17 result in a final copy of the original character pattern. If desired, further fixing techniques such as conventional heat or solvent fixing may be utilized.

The magnetic particles 15 and 16 may be transferred to the surface 17 by conventional magnetic transfer techniques. Hence, a magnetic field may be applied to that side of surface 17 that is remote from the magnetic particles 15 and 16. The applied magnetic field may be greater than the local magnetic field attributed to the trapped magnetic flux 12 and 13 so as to overcome the attractive forces exerted on particles 15 and 16. Hence, the magnetic particles 15 and 16 will adhere to the surface 17 under the influence of the applied magnetic field. It is understood that a suitable magnetic field may be applied by a permanent magnet or by an electromagnet similar to the aforementioned source of magnetic field described with reference to FIG. 1A. The magnetic particles 15 and 16 adhering to the surface 17 may then be fixed to the surface by any of the aforedescribed fixing techniques.

Another embodiment that is contemplated for developing the magnetostatic latent image is illustrated in FIG. 2. In this embodiment, diamagnetic particles 18 are applied to the surface of the superconductive material 1. One of ordinary skill in the art will appreciate that a diamagnetic material has a magnetic permeability that is less than 1 and a repelling force is exerted thereon by a magnetic field to which it is exposed. Typical examples of diamagnetic materials are bismuth and anitmony. It is recalled that superconductive materials exhibiting the superconducting state admit of excellent diamagnetic properties. Accordingly, the diamagnetic particles 18 may be comprised of a suitable diamagnetic material such as the aforementioned bismuth or antimony, or may be comprised of a superconductive material such as that described at pages 5 and 6 of the text *Superconductivity*. Since the ambient temperature is sufficient to maintain the superconductive material 1 in its superconducting state, it is readily apparent that if diamagnetic particles 18 are comprised of superconductive material said particles will admit of their superconducting states. The diamagnetic particles 18 may be applied to the surface of superconductive material 1 in any suitable manner such as that described hereinabove with respect to FIG. 1D.

A repelling force is exerted on the diamagnetic particles 18 by the magnetic flux 12 and 13 trapped in portions 10 and 11, respectively. Accordingly, diamagnetic particles 19 will be deposited on the surface of the superconductive material 1 in such areas that are substantially free of trapped magnetic flux. Consequently, no diamagnetic particles will be deposited on portions 10 and 11. Thus, it is seen that those regions of the magnetostatic latent image that correspond to the dark areas of the original character pattern 8 will have diamagnetic particles 19 deposited thereon, whereas those regions of the magnetostatic latent image that correspond to the light areas of the character pattern 8 will have no diamagnetic particles deposited thereon. Accordingly, if character pattern 8 corresponds to a photographic negative, the development illustratively represented in FIG. 2 corresponds to a photographically positive developing process such that the viewable image is also a photographic negative. However, if character pattern 8 comprises an original document to be reproduced, i.e., a photographic positive, the photographically positive developing process results in a photographically positive viewable image. The viewable image thus formed by the selectively deposited diamagnetic particles 19 may be transferred to a suitable support surface in a manner analogous to that previously described with reference to FIG. 1E.

After the developed viewable image is transferred to a suitable support surface, the superconductive material 1 may be made ready for reuse by removing residual magnetic (or diamagnetic) particles from the surface thereof and by freeing the magnetic flux 12 and 13 trapped within certain portions 10 and 11 thereof. Removal of the residual magnetic (or diamagnetic) particles from the surface of the superconductive material 1 may be accomplished by suitable cleaning means such as a rotating brush or the like. The trapped magnetic field may be erased by increasing the ambient temperature to a value above the critical temperature value. When the ambient temperature is thus increased, the superconducting rings that had previously formed about portions 10 and 11 will dissipate. Hence, the superconducting state of the entire superconductive material 1 will be quenched and the superconductive material will admit of its normal state. The superconductive material is now ready to be reused in the aforedescribed manner.

To briefly summarize the magnetophotographic reproducing technique utilizing superconductive material that has thus far been disclosed, the ambient temperature is initially maintained above a critical temperature value whereby the superconductive material 1 exhibits its normal state. An external magnetic field 3 that is less than the critical field value is applied. The magnetic properties of the superconductive material 1 permit the external magnetic field to penetrate the superconductive material. The imaging of a character pattern onto the surface of the superconductive material 1 transfers sufficient heat thereto such that the temperature of certain portions thereof is selectively increased in accordance with the light and dark areas of the imaged character pattern. When the ambient temperature is then decreased below the critical temperature value, the superconductive material is driven to its superconducting state except for said certain portions which remain in their normal state. Consequently, the externally applied magnetic field 3 is expelled from the remainder of the superconductive material but remains in said certain portions. When the ambient temperature is sufficiently decreased, rings of superconductive material form about said certain portions to interrupt the continuous flux paths previously provided, thereby trapping the penetrated magnetic flux in said certain portions. The imaged character pattern and applied magnetic field may then be terminated. The trapped magnetic flux forms a magnetostatic latent image of the imaged character pattern, which magnetostatic latent image may be developed and transferred to a support surface. It should be understood that although the step of applying an external magnetic field 3 and the step of imaging a character pattern onto the superconductive material 1 in the presence of the external magnetic field 3 have been described as individual steps, these steps may be performed substantially simultaneously. Also, the external magnetic field may be applied in preceding or succeeding relation with respect to the imaging of the character pattern.

Figure 3B:
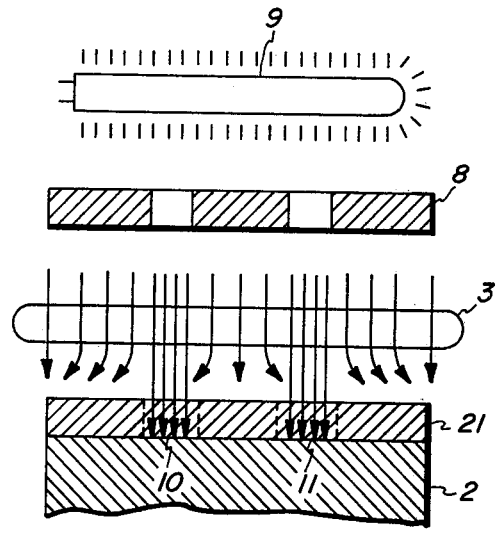
Figure 3C:
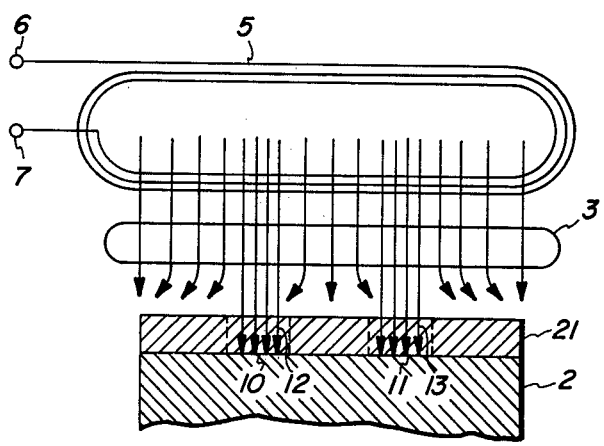

Turning now to FIGS. 3A–3C, another embodiment of the instant invention whereby a magnetostatic latent image is produced will now be described. Referring first to FIG. 3A, superconductive material 21, which is similar to superconductive material 1 of FIGS. 1A–1E, is here illustrated as a thin film mounted on substrate 2 such that the superconductive material is in good thermal contact with the substrate. As is, of course, recognized, the superconductive material need not be limited to a thin film configuration and, in addition, the substrate 2 may be omitted. In the described embodiment, the superconductive material is initially disposed in its superconducting state. Accordingly, the ambient temperature is decreased below the critical temperatue value for the particular superconductive material, as by immersing the superconductive material 21 in a liquid helium bath, not shown, or by exposing the superconductive material to helium vapor, or by immersing substrate 2 in a liquid helium bath.

Once the superconducting state is obtained, superconductive material 21 is subjected to a magnetic field 3 of less than a critical field value. The magnetic field is similar to that described hereinabove with respect to FIG. 1A and may be generated by any of the aforedescribed means. Since the external magnetic field 3 is less than the critical field value, superconductive material 21 remains in its superconducting state. It may be appreciated that the magnitude of the external magnetic field is preferably just below the critical field value associated with the ambient temperature such that a relatively small increase in ambient temperature or a relatively small increase in the external magnetic field or any combination thereof results in a quenching of the superconducting state of the superconductive material. Nevertheless, the superconductive material 21 admits of a stable superconducting state in the presence of the external magnetic field 3, and the diamagnetic qualities thereof prohibit the magnetic field from penetrating therein. FIG. 3A illustrates that the lines of magnetic flux are expelled from the interior of the superconductive material 21.

The superconductivity of the superconductive material may be selectively quenched by projecting radiant energy of a sufficient wavelength thereon to increase the temperature at the surface thereof. As illustrated in FIG. 3B, radiant energy is projected by a source of radiant energy 9 and subsequently modulated by the character pattern 8 interposed between source 9 and superconductive material 21. It is recalled that character pattern 8 may comprise conventional film means bearing images of information prerecorded thereon or character pattern 8 may comprise a document having graphic information prerecorded thereon such that radiant energy transmitted thereto is modulated and reflected by the character pattern to the superconductive material 21. The prerecorded information is comprised of light and dark portions whereby radiant energy admitting of a maximum amplitude represents light portions and radiant energy admitting of a minimum amplitude represents dark portions in the conventional manner. Those portions of the superconductive material 21 upon which the light areas of the character pattern are imaged, i.e., those portions upon which radiant energy of a maximum amplitude impinges, will experience an increase in temperature. The superconducting state of those portions will, therefore, be quenched and said portions will be driven into the normal state. At the same time, however, those portions of the superconductive material 21 upon which the dark areas of the character pattern are imaged, i.e., those portions upon which radiant energy of a minimum amplitude impinges, remain in the superconducting state. Those portions of the superconductive material that have been driven into the normal state reject their diamagnetic properties. Since the character pattern is imaged onto the superconductive material 21 in the presence of the external magnetic field 3, the external magnetic field is now enabled to penetrate those portions exhibiting the normal state. FIG. 3B illustrates that lines of magnetic flux penetrate portions 10 and 11 of superconductive material 21, which portions receive radiant energy representing the light areas of character pattern 8.

Although the foregoing has described the use of radiant energy to selectively increase the temperature at the surface of the superconductive material 21, it is recalled that the present invention contemplates the transfer of thermal energy to the surface of the superconductive material from an array of, for example, selectively activatable thermal elements. Accordingly, the combination source of radiant energy 9 and character pattern 8 may be replaced by such array.

It should be pointed out that if superconductive material 21 were comprised of a continuous material devoid of impurities, such as the preferred embodiment of superconductive material 1 previously described with respect to FIGS. 1A–1E, execution of the just-described imaging operation might not result in the penetration of magnetic flux into the non-superconducting portions of the superconductive material 21. More particularly, the imaging an area with radiant energy might drive a portion of the superconductive material 21 into its normal state while a non-imaged surrounding area might form a continuous ring of superconductive material around the non-superconductive portion. Consequently, a current may be induced to flow in the superconducting ring in a direction that generates a local magnetic field that tends to oppose the external magnetic field 3. The local magnetic field and external magnetic field exhibit a cancelling effect such that no magnetic field is able to penetrate the surrounded non-superconducting portions of the superconductive material 21. Hence, the imaging of a character pattern onto a continuous superconductive material would not produce the desired results. Consequently, the superconductive material 21 includes some impurities therein whereby a continuous superconducting ring cannot be formed about an imaged non-superconducting portion. For the purpose of the present invention, the term impurities is assumed to describe the microscopic properties of superconductive material 21, or the macroscopic properties thereof. In the latter regard, the superconductive material 21 may comprise a multiple of isolated superconductive particles suspended in a suitable resin binder, or the superconductive material may be formed of islands of superconductive material on a substrate, such as by evaporation techniques employing a mask.

It is clear from an understanding of superconductive materials that if the temperature of the certain portions 10 and 11 is decreased below the critical temperature values, those portions will be returned to their superconducting state. Moreover, the magnetic flux that has penetrated these portions 10 and 11 will be trapped therein. FIG. 3C illustrates that the portions 10 and 11 may be returned to their superconducting states merely by terminating the imaging operation illustrated in FIG. 3B. This may be readily accomplished by deactivating the source of radiant energy 9 or by removing the superconductive material 21 from the imaging area. If the portions 10 and 11 have been driven into the normal state by the transfer thereto of thermal energy derived from a stylus comprised of an array of thermal elements, the superconducting state of those portions may be restored by terminating further transfer of thermal energy. In any event, when additional thermal energy is no longer applied to the superconductive material 21, as by the conversion of radiant energy into thermal energy or by the direct transfer of thermal energy, the portions 10 and 11 of the superconductive material 21 return to their superconductive states. However, the impurities included in those portions 10 and 11 contribute to an irregular return to the superconducting state. For example, the impurities might return to their superconducting states at temperatures that are lower than the critical temperature value of the superconductive material 21. Hence, in the presence of the external magnetic field 3 the impurities included in the portions 10 and 11 might remain in their normal states even when the light image of the character pattern is removed. As a consequence thereof, the magnetic flux 12 and 13 that has penetrated into the portions 10 and 11 are trapped in the impurities that have remained in their normal states. Moreover, rings of superconductive material form around such impurities and the magnetic flux trapped therein to maintain the lines of flux at a constant value. If the ambient temperature is further decreased, portions of the impurities are able to return to their superconducting states thereby tightening the surrounding superconducting rings. Since, however, the number of magnetic lines of flux trapped within the remaining normal impurities is a constant value, the intensity of the trapped field increases. It should be appreciated that when the imaging of a character pattern is terminated, the temperature of portions 10 and 11 will decrease in a gradual and continuous manner. Hence, for the case wherein superconductive material 21 includes isolated particles or islands of superconductive material, the particles or islands included within portions 10 and 11 will gradually return to their superconducting states thereby trapping penetrated magnetic flux by the contracting superconductive rings.

It is recalled that the length of time required to decrease the temperature of portions 10 and 11 such that stable superconducting rings are formed to trap the magnetic flux 12 and 13 therein is a function of the thickness of the superconductive material and the thermal contact between the superconductive material and its low temperature surroundings. At the conclusion of this time delay, the external magnetic field 3 may be removed while the trapped magnetic flux 12 and 13 is maintained in portions 10 and 11, respectively. Thus, a magnetostatic latent image of a character pattern is formed in the superconductive material 21.

Although the imaged radiant energy (or thermal energy) and the external magnetic field 3 may be removed substantially simultaneously from the superconductive material 21, it is preferred to provide the aforementioned time delay for the foregoing reasons. It is readily apparent that if the external magnetic field 3 is removed prior to the termination of the imaging operation, the penetrating magnetic flux will not be trapped within portions 10 and 11. This occurs because during the imaging operation the portions 10 and 11 are driven out of their superconducting states. Consequently, superconducting rings cannot form about the particles or islands within portions 10 and 11 or about the penetrating magnetic flux during imaging. When the external magnetic field is removed, the penetrating magnetic flux likewise is removed. Therefore, in the illustrated embodiment, it is contemplated that the superconductive material 21 disposed in the external magnetic field 3 be exposed to an imaged character pattern for a predetermined period of time. The external magnetic field 3 is removed at a time subsequent to the termination of said predetermined period of time.

FIG. 3C has illustrated that portions 10 and 11 may be returned to their superconducting states by terminating the imaging opration. This is not the sole technique contemplated to trap the penetrated magnetic flux in said portions. Since the superconductivity of portions 10 and 11 is dependent upon the temperature thereat and the applied magnetic field, it is apparent that other procedures may be employed to obtain a magnetostatic latent image. For example, the ambient temperature might be sufficiently decreased whereby the temperature of portions 10 and 11 is driven below the critical temperature value notwithstanding the impinging radiant energy. Accordingly, stable superconducting rings will be formed to trap the magnetic flux 12 and 13 in portions 10 and 11, even in the presence of an imaged 12 and 13 in portions 10 and 11, even in the presence of an imaged character pattern. Once the magnetic flux is trapped in this manner, the imaged character pattern and the external magnetic field may be removed simultaneously or in any desired order.

As an alternate example, the external magnetic field may be reduced to a magnitude that is not capable of supporting the normal state of portions 10 and 11 even in the presence of the imaged character pattern. Hence, the combined effects of the low ambient temperature and the decreased magnetic field might be sufficient to return portions 10 and 11 to the superconducting state, thereby trapping the penetrated magnetic flux in said portions. The imaged character pattern and the external magnetic field may then be removed.

In the foregoing description of FIGS. 3A and 3B, it has been assumed that the character pattern is imaged onto the superconductive material 21 disposed in an external magnetic field 3. It is, of course, apppreciated that the step of imaging may precede the application of the external magnetic field to the superconductive material so that portions 10 and 11 are driven into their normal state enabling the subsequently applied external magnetic field to penetrate therein. Additionally, the character pattern may be imaged onto the superconductive material substantially simultaneously with the application of the external magnetic field. Each of these embodiments, nevertheless, contemplates the imaging of the character pattern onto superconductive material disposed in an external magnetic field. The resulting penetrating flux may then be trapped in portions 10 and 11 in the now understood manner.

The magnetostatic latent image formed by the magnetic flux trapped in portions 10 and 11 may now be developed to form a viewable image of the original character pattern in the manner previously described with respect to FIG. 1D or FIG. 2. Accordingly, further description of the development of the magnetostatic latent image need not be provided. As is understood, the developed image may, if desired, be transferred to a suitable support surface such as surface 17 of FIG. 1E. After transfer of the developed image, the superconductive material 21 may be prepared for reuse. Residual magnetic (or diamagnetic) particles are removed from the surface of the superconductive material and the trapped magnetic flux is erased by increasing the ambient temperature to a value in excess of the critical temperature value. When the ambient temperature is thus increased, the superconducting rings that had previously formed about the impurities in portions 10 and 11 will dissipate. In accordance with the well-known Meissner effect, the trapped magnetic flux will be expelled from the interior of the portions 10 and 11 of superconductive material 21. The superconductive material is now restored to its normal state.

The specific structure that may be utilized in carrying out the novel process of the present invention is not essential for a sufficient understanding thereof. However, the superconductive material 1 or 21 may be formed into a drum configuration, an endless belt configuration or the like. The just mentioned configurations may also be adopted if the superconductive material 1 or 21 comprises a thin film coating on substrate 2. Moreover, the superconductive material may be disposed in a suitable dewar or other vessel for accurate control of the ambient temperature. It may be appreciated that the novel techniques disclosed herein are capable of producing line copy or continuous tone images. Thus, while the invention has been particularly shown and described with reference to specific embodiments thereof, it will be obvious to those skilled in the art that the foregoing and various other changes and modifications in form and details may be made without departing from the spirit and scope of the invention. It is, therefore, intended that the appended claims be interpreted as including all such changes and modification.

What is claimed is:
1. Apparatus for producing images, including:
    a superconductive material disposed in an ambient temperature below the superconductivity critical temperature of the material and in a magnetic field of a level below the threshold level of said material,
    a source of radiant energy to irradiate an object pattern of light and dark areas,
    means to propagate said radiant energy from said object pattern to said material to irradiate said material with said radiant energy imagewise of said object pattern, thereby to raise the temperature of said material imagewise above its superconductivity critical temperature,
    whereby said magnetic field is permitted to permeate said material imagewise to create a magnetostatic image of said object pattern thereon.

* * * * *